(12) United States Patent
Yuda

(10) Patent No.: US 7,388,253 B2
(45) Date of Patent: Jun. 17, 2008

(54) NONVOLATILE MEMORY

(75) Inventor: Takashi Yuda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/369,983

(22) Filed: Mar. 8, 2006

(65) Prior Publication Data
US 2006/0202284 A1 Sep. 14, 2006

(30) Foreign Application Priority Data
Mar. 11, 2005 (JP) ............................. 2005-068507

(51) Int. Cl.
H01L 27/105 (2006.01)
(52) U.S. Cl. ....................... 257/316; 257/324
(58) Field of Classification Search ................ 257/315, 257/316, 324
See application file for complete search history.

(56) References Cited

U.S. PATENT DOCUMENTS

| 6,627,946 | B2 * | 9/2003 | Wang .......................... 257/316 |
| 6,861,699 | B2 * | 3/2005 | Kim ............................ 257/316 |
| 7,053,441 | B2 * | 5/2006 | Owa ........................... 257/315 |
| 7,176,517 | B2 * | 2/2007 | Koh ............................ 257/315 |
| 7,196,371 | B2 * | 3/2007 | Pan et al. .................... 257/315 |
| 2002/0137296 | A1 * | 9/2002 | Satoh et al. ................. 438/301 |
| 2003/0223296 | A1 * | 12/2003 | Hu et al. ..................... 365/201 |
| 2005/0173756 | A1 * | 8/2005 | Kim et al. ................... 257/316 |

FOREIGN PATENT DOCUMENTS

JP 2001-168219 6/2001

* cited by examiner

Primary Examiner—Leonardo Andujar
Assistant Examiner—Wensing W Kuo
(74) Attorney, Agent, or Firm—Volentine & Whitt, P.L.L.C.

(57) ABSTRACT

Source diffusion layers and drain diffusion layers are alternately formed in lateral device forming regions separated by device isolation regions. Control gate electrodes are formed on both sides of each source diffusion layer through gate ONO films interposed therebetween. Gate electrodes are formed over their corresponding side surfaces of the control gate electrodes through inter-gate electrode insulating films interposed therebetween respectively. The control gate electrodes and the gate electrodes are respectively connected in a vertical direction by a source line and word lines on each device isolation region. Further, an intermediate insulating film is formed over the surface of a silicon substrate formed with memory cells, and each lateral drain diffusion layer is connected to a bit line through contacts.

10 Claims, 5 Drawing Sheets

NONVOLATILE MEMORY

BACKGROUND OF THE INVENTION

The present invention relates to a nonvolatile memory, and particularly to a structure of a memory cell and a manufacturing method thereof.

Related arts will be explained using the following cited references:

Patent document 1: Japanese Unexamined Patent Publication No. 2001-168219

Nonpatent document 1: Yutaka Hayashi, et al, "Twin MONOS Cell with Dual Control Gates", 2000 Symposium VLSI Technology Digest of Technical Papers.

FIG. 2 is a configuration diagram of a conventional nonvolatile memory described in the nonpatent document 1 and shows a cross-section of a twin MONOS (Twin Metal-Oxide-Nitride-Oxide-Semiconductor) cell having two control gates separated from each other. One memory cell MC comprises two memory elements ML and MR, one diffusion region D (consisting of diffusion regions D1 and D2) and one word gate WG. The memory elements ML and MR respectively comprise CGL and CGR each equivalent to half of a control gate CG formed of polysilicon, and insulating films, i.e., ONO (Oxide-Nitride-Oxide) films constituted of an oxide film, a nitride film and an oxide film, which are disposed below the CGL and CGR to store electrical charges therein. The pair of memory elements ML and MR is disposed on both sides of the common control gate CG and shares the use of adjacent memory cells MCs and a word gate WG.

The control gates CGL and CGR divided into the two are electrically connected and share the same diffusion regions D which serve as bit lines. However, the ONO films disposed on the sides below the control gates CGL and CGR are separated from each other. The word gates WG, control gates CG and diffusion regions D are electrically connected in a memory array. For example, control lines are respectively provided on the diffusion regions D so as to be parallel with the diffusion regions and orthogonal to word lines.

Write and read operations of such a twin MONOS cell are performed as follows:

When, for example, writing (injection of electrons) is effected on the memory element MR, the potential of the diffusion region D1 on the memory element ML side is set to 0V, and the potential of the diffusion region D2 on the memory element MR side is set to 5V. The potential of the control gate CGL on the memory element ML side is set to 3.3V, and the potential of the control gate CGR on the memory element MR side is set to 6V. Further, the potential of the word gate WG is set to 1.5V. Incidentally, a substrate is at a ground potential GND.

Thus, since the voltage of 5V is applied between the diffusion regions D1 and D2, a current flows from the diffusion region D2 to the diffusion region D1. Some of the electrons that flow from the diffusion region D1 to the diffusion region D2 through the substrate are attracted to the control gate CGR to which the high voltage (6V) is applied, and stored in the corresponding ONO film of the memory element MR as CHE (Channel Hot Electrons).

On the other hand, when the contents of the memory element MR are read, the potential of the diffusion region D1 remains at 0V and the potential of the diffusion region D2 is set to 1.5V. Further, the potential of the control gate CGL is set to 5V and the potential of each of the control gate CGR and word gate WG is set to 2.5V. Incidentally, the substrate is at the ground potential GND. In this state, the contents of the memory element MR are determined according to whether the current flows through the control gate CGR. That is, if the electrons are being stored in the memory element MR, then no current flows. If not so, then the current flows.

Thus, since the twin MONOS cell makes use of such an SSI (Source Side Injection) system that a high voltage is applied to one of two gates arranged in a lateral direction with respect to a channel to bring one to a strong inverse state and bring the other thereof to a weak inverse state, thereby generating a high electric field between the gates to carry out an electron injection, it has the feature that the efficiency of the electron injection is high and high-speed writing can be performed with low power consumption. Since one memory cell MC has the two memory elements ML and MR, the twin MONOS cell has the feature that its densification is enabled.

However, the twin MONOS cell has the following problems.

That is, since it is necessary to form the gates on the ONO films, the structure of the memory cell becomes complicated and strict alignment becomes necessary, whereby Its manufacture becomes difficult. Since the diffusion regions D are formed on the substrate side-by-side so as to adjoin each other, a problem arises in that there is a fear that the influence of a high voltage on each memory element unintended for writing occurs.

SUMMARY OF THE INVENTION

The present invention has been made in terms of the foregoing. The present invention therefore aims to provide a nonvolatile memory cell which is capable of high-speed writing with low power consumption and is simple in structure, and a manufacturing method thereof.

According to one aspect of the present invention, for attaining the above object, there is provided a nonvolatile memory comprising:

device isolation regions formed over a silicon substrate and device forming regions interposed therebetween;

a plurality of first diffusion layers formed by diffusing an impurity into a surface of the silicon substrate in the device forming regions at predetermined intervals;

a plurality of second diffusion layers formed by diffusing an impurity into the surface of the silicon substrate between the adjacent first diffusion layers;

first and second ONO films for data storage, which are formed over the silicon substrate on both sides of the second diffusion layer by sequentially generating an oxide film, a nitride film and an oxide film;

first and second control gate electrodes respectively formed over the first and second ONO films;

source lines which electrically connect the second diffusion layers and the first and second control gate electrodes and supply control voltages for reading and erasing of data to and from the first or second ONO film;

first gate electrodes each formed via an insulating film over the silicon substrate so as to adjoin the first control gate electrode with the insulating film interposed therebetween;

second gate electrodes each formed via an insulating film over the silicon substrate so as to adjoin the second control gate electrode with the insulating film interposed therebetween; and bit lines provided every device forming region, for electrically connecting the plurality of first diffusion layers formed in the respective device forming regions and reading and writing data from and to the first or second ONO film.

In the present invention, the common source line connects the source diffusion layer and first and second control gate electrodes of each memory cell selected by the common first or second gate electrode. Thus, advantageous effects are brought about in that a low current and high-speed writing are enabled in a manner similar to the conventional MONOS cell, and the memory cell can greatly be simplified in structure as compared with the conventional MONOS cell in which the source diffusion layer and the control gate electrodes are isolated by the insulating film.

According to another aspect of the present invention, for attaining the above object, there is provided a method for manufacturing a nonvolatile memory, comprising and sequentially executing the steps of:

forming a plurality of strip-like device isolation regions over a silicon substrate and thereafter sequentially forming an oxide film and a nitride film over the silicon substrate;

removing the nitride film in strip form so as to be orthogonal to the device isolation regions and forming a plurality of trenches serving as forming regions of memory elements by the remaining nitride films;

forming data storage ONO films constituted of the oxide film, the nitride film and the oxide film inside the plurality of trenches respectively and filling the interiors of the trenches with first polysilicon serving as control gates;

etching the first polysilicon to leave sidewalls constituted of the first polysilicon and the ONO films over wall surfaces of the trenches and forming spaces reaching the silicon substrate in the centers of the trenches;

diffusing an impurity into a surface of the silicon substrate from the spaces defined in the centers of the trenches to form source diffusion layers;

embedding second polysilicon serving as source lines into the trenches and planarizing a surface thereof and thereafter oxidizing the surface to form the memory elements;

removing the nitride films left over the silicon substrate to expose the memory elements and thereafter depositing third polysilicon over the entire surface of the silicon substrate;

etching the third polysilicon to leave sidewalls serving as gate electrodes and word lines over wall surfaces of the plurality of memory elements;

covering the entire surface of the silicon substrate over which the memory elements and the sidewalls are left, with an intermediate insulating film, and planarizing a surface of the intermediate insulating film;

forming contact holes reaching the silicon substrate in the intermediate insulating film between the adjacent memory elements and diffusing an impurity into the surface of the silicon substrate through the contact holes to form drain diffusion layers; and charging contacts into the contact holes respectively and forming bit lines for electrically connecting the drain diffusion layers in the respective device isolation regions.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

A nonvolatile memory of the present invention can be manufactured in the following manner, for example.

A plurality of strip-like device isolation regions are first formed on a silicon substrate. Then, an oxide film and a nitride film are sequentially formed over the silicon substrate. The nitride film is removed in strip form so as to be orthogonal to these device isolation regions and a plurality of trenches used as memory element forming regions are formed by the remaining nitride films.

Next, ONO films for data storage are formed inside the trenches and the interiors of the trenches are filled with first polysilicon which serves as control gates. The first polysilicon is etched to leave sidewalls comprised of polysilicon and the ONO films at their corresponding wall surfaces of the trenches and define spaces reaching the silicon substrate in the centers of the trenches respectively. And an impurity is diffused into the surface of the silicon substrate through the spaces defined in the centers of the trenches to form source diffusion layers.

Next, second polysilicon, which functions as source lines, is embedded into the trenches and its surface is planarized. Thereafter, the surface thereof is oxidized to form memory elements. Further, the nitride film left over the silicon substrate is removed to expose the memory elements, after which third polysilicon is deposited over the entire surface of the silicon substrate. Then, the third polysilicon is etched to leave gate electrodes and sidewalls used as word lines on wall surfaces of the memory elements respectively. The entire surface of the silicon substrate is covered with an intermediate insulating film and its surface is planarized.

Thereafter, contact holes, which reach the silicon substrate, are defined in the intermediate insulating film provided among the plurality of memory elements. An impurity is diffused into the surface of the silicon substrate through the contact holes to form drain diffusion layers. Further, the interiors of the contact holes are filled with contacts to form bit lines which electrically connect the drain diffusion layers lying in the respective device isolation regions.

The above and other objects and novel features of the present invention will become more completely apparent from the following description of preferred embodiments when the same is read with reference to the accompanying drawings. The drawings, however, are for the purpose of illustration only and by no means limit the invention.

FIRST PREFERRED EMBODIMENT

Figure 1C:
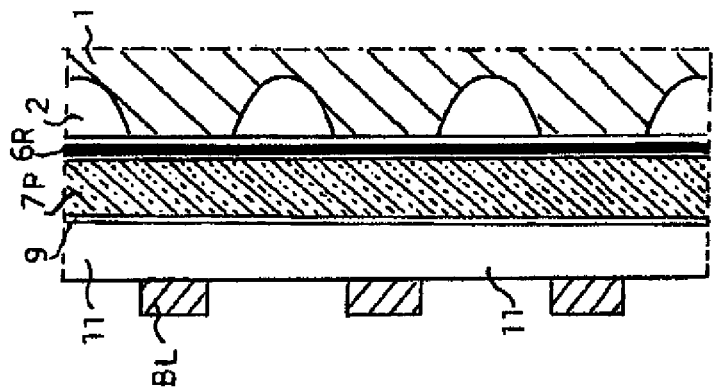
FIG. 1 is a configuration diagram of a nonvolatile memory showing a first embodiment of the present invention.
Figure 1A:
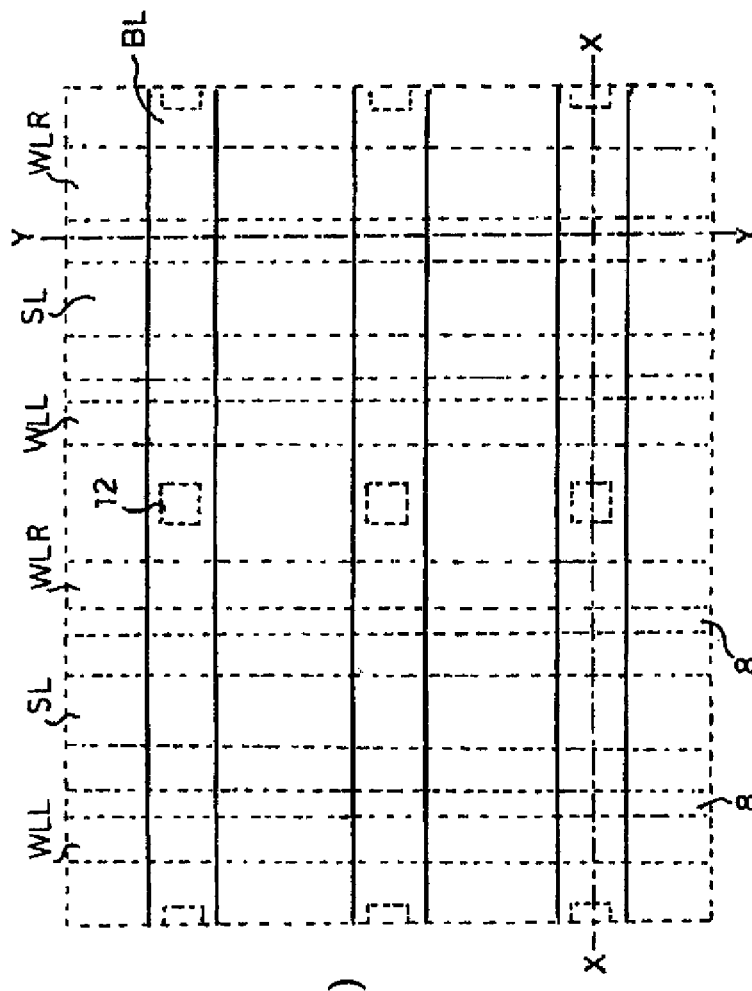
Figure 1B:
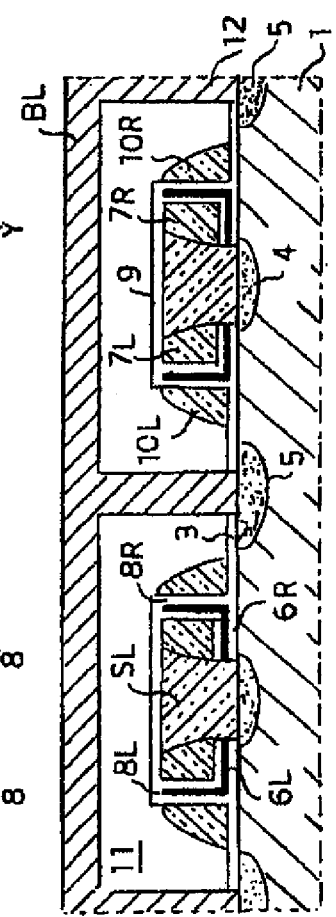
Figure 2:
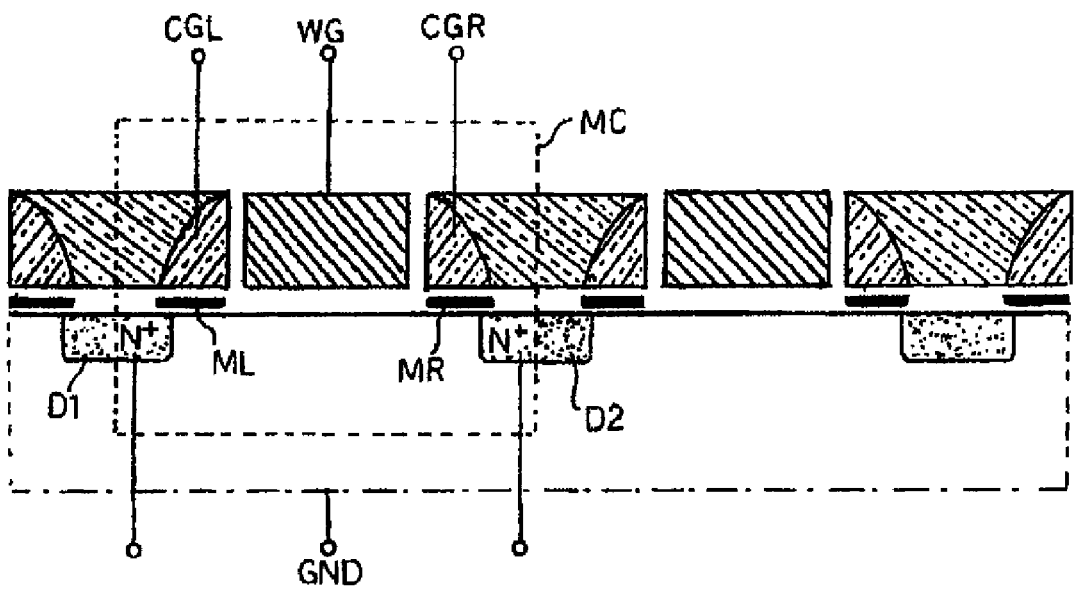
FIG. 2 is a configuration diagram of a conventional nonvolatile memory.

FIGS. 1(a) through 1(c) are respectively configuration diagrams of a nonvolatile memory showing a first embodiment of the present invention, wherein FIG. 1(a) is a plan view showing part of a memory array in which memory cells are formed in matrix form, and FIGS. 1(b) and 1(c) are respectively sectional views of parts taken along line X-X and line Y-Y in the plan view.

The nonvolatile memory has a plurality of MONOS type memory cells disposed and formed on a p type silicon substrate 1 in matrix form as viewed in the vertical and horizontal directions. Strip-like device isolation regions 2 are formed on the silicon substrate 1 in parallel at predetermined intervals (they are shown so as to extend in the lateral direction in the plan view). The device isolation regions 2 separate the memory cells arranged in the vertical direction as viewed in the figure. They are, for example, insulating regions formed by oxidizing the silicon substrate 1. A plurality of strip-like regions interposed among the device isolation regions 2 are provided as device forming regions or areas. The plurality of memory cells are formed in the device forming regions side-by-side as viewed in the lateral direction.

An insulating oxide film 3 is formed on the surface containing the device isolation regions 2, of the silicon substrate 1 except for source and drain regions. The source regions and the drain regions are alternately provided in the device forming regions at predetermined intervals. n+ ions of an impurity are diffused into these regions of the silicon substrate 1, and these regions are disposed as source diffusion layers 4 and drain diffusion layers 5.

Gate ONO films 6L and 6R (added with suffixes of L and R according to left and right in the figure in the present embodiment) each corresponding to an insulating film for data storage are respectively formed over the silicon substrate 1 on both sides of the source diffusion layers 4. Further, n-type polysilicon layers, which serve as control gate electrodes 7L and 7R, are formed over these gate ONO films 6L and 6R respectively, n-type polysilicon is charged between the control gate electrodes 7L and 7R. This polysilicon is formed across the device isolation regions 2 so as to electrically connect the respective control gate electrodes 7L and 7R of the memory cells arranged in the vertical direction of the figure and constitutes source lines SL.

Side surfaces of the control gate electrodes 7L and 7R are respectively covered with inter-gate electrode insulating films 8L and 8R based on an ONO film, which are formed simultaneously with the gate ONO films 6L and 6R. The upper sides of the control gate electrodes 7L and 7R and source lines SL are covered with an insulating film 9 such as silicon oxide or the like. Gate electrodes 10L and 10R based on the n-type polysilicon are respectively formed outside the control gate electrodes 7L and 7R with the inter-gate electrode insulating films 8L and 8R interposed therebetween. The respective gate electrodes 10L and 10R of the memory cells arranged in the vertical direction of the figure are respectively electrically connected by word lines WLL and WLR based on the n-type polysilicon, which are formed over the device isolation regions 2 simultaneously with these gate electrodes 10L and 10R.

An intermediate insulating film 11 is formed over the surface of the silicon substrate 1 formed with the insulating film 9, gate electrodes 10L and 10R and word lines WLL and WLR, etc. Further, bit lines BL each made up of a metal wiring such as aluminum are formed on the intermediate insulating film 11 so as to extend along the device forming regions as viewed in the lateral direction of the figure. Contacts 12 made up of tungsten or the like electrically connect the bit lines BL and their corresponding drain diffusion layers 5 in the device forming regions.

Figure 3:
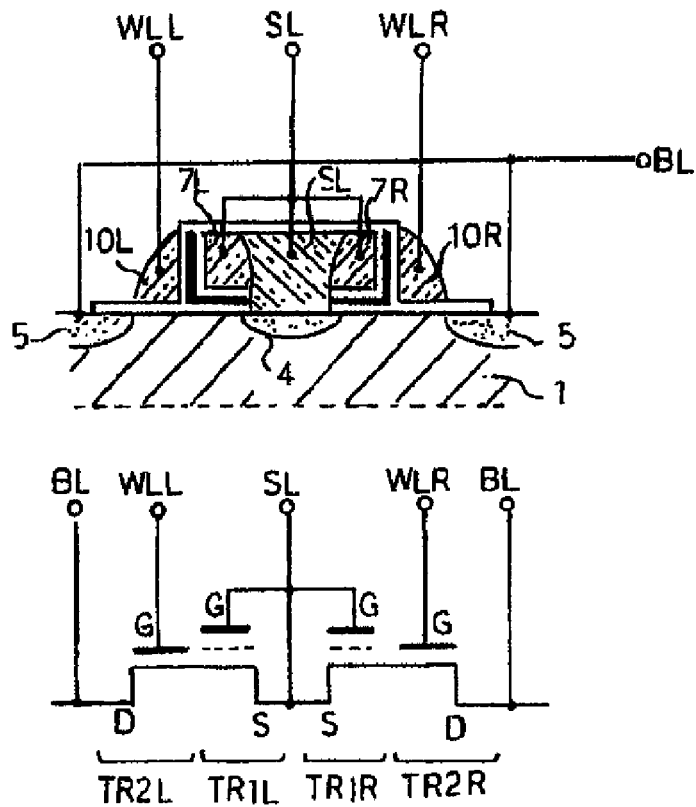
FIG. 3 is a diagram for describing an equivalent circuit corresponding to each memory cell of FIG. 1.

FIG. 3 is a diagram for describing an equivalent circuit corresponding to each memory cell in FIG. 1.

The memory cell is capable of storing 2 bits independently by virtue of the gate ONO film 6L on the left side and the gate ONO film 6R on the right side. A memory or memory section on the left side comprises a transistor TR1L for storage and a transistor TR2L for switching, and a memory or memory section on the right side comprises a transistor TR1R for storage and a transistor TR2R for switching.

The source diffusion layer 4 shown in FIG. 1 corresponds to source electrodes S of the transistors TR1L and TR1R. The control electrodes 7L and 7R respectively correspond to gate electrodes G of the transistors TR1L and TR1R. The source line SL common-connects the source electrodes S and gate electrodes G of these transistors TR1L and TR1R.

Also the gate electrodes 10L and 10R shown in FIG. 1 respectively correspond to gate electrodes G of the transistors TR2L and TR2R. The drain diffusion layers 5 respectively correspond to drain electrodes D of these transistors TR2L and TR2R. Incidentally, the gate electrodes G of the transistors TR2L and TR2R corresponding to the memory cells arranged in the vertical direction in FIG. 1(a) are common-connected to their corresponding word lines WLL and WLR. The drain electrodes D of the transistors TR2L and TR2R corresponding to the memory cells arranged in the lateral direction are common-connected to their corresponding bit lines BL.

Figures 4A, 4B:
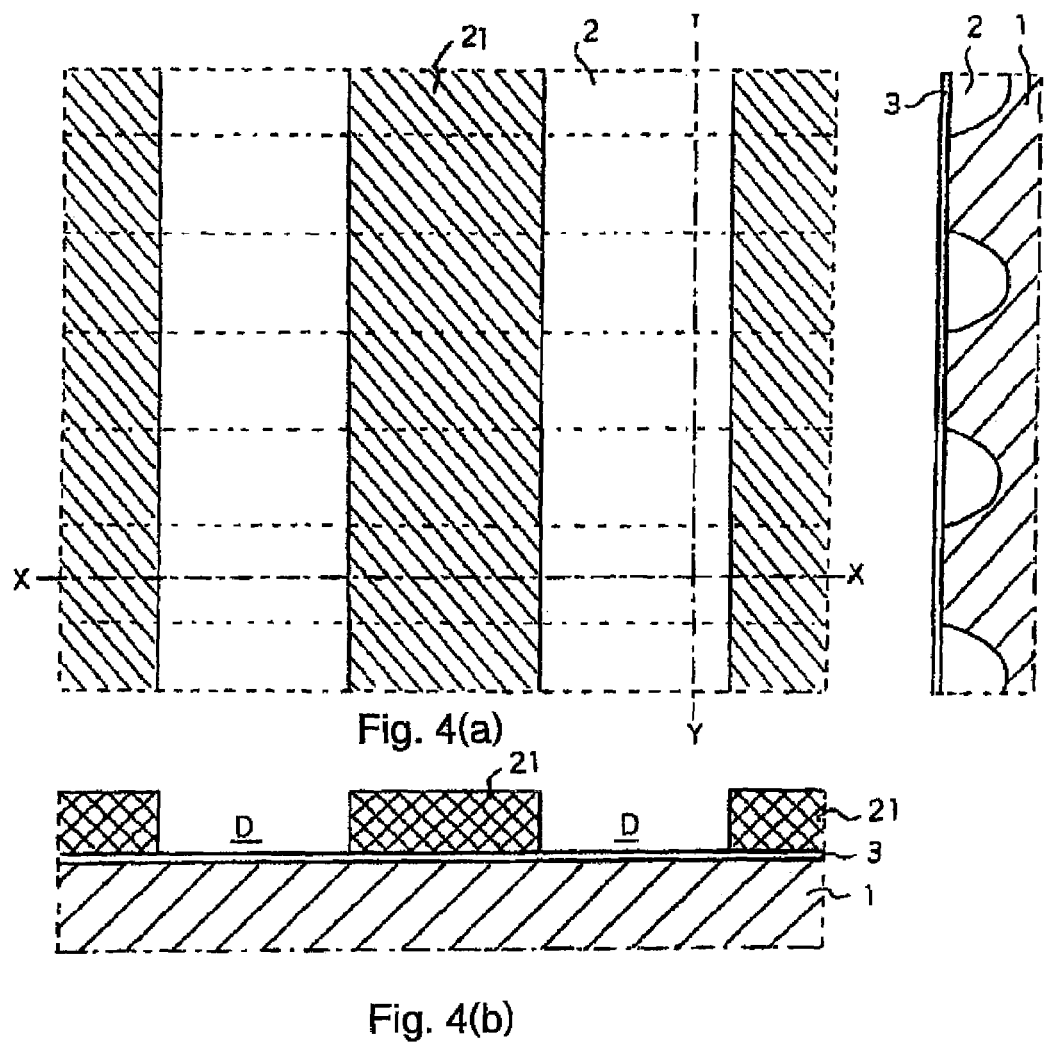
FIG. 4 is a process diagram (part 1) showing a method for manufacturing the memory cells of FIG. 1.
Figure 5A:
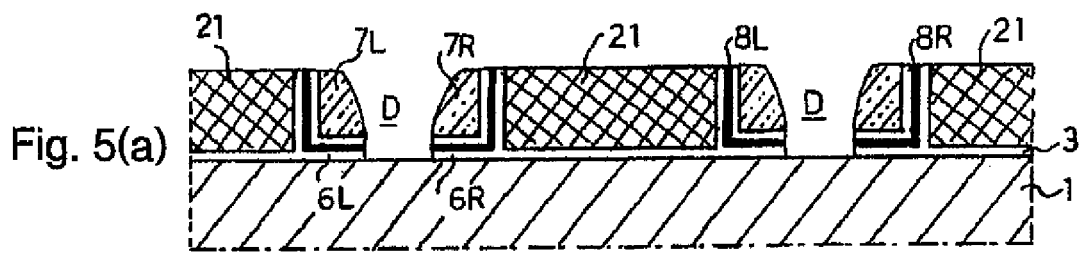
FIG. 5 is a process diagram (part 2) illustrating the method for manufacturing the memory cells of FIG. 1.
Figure 5B:
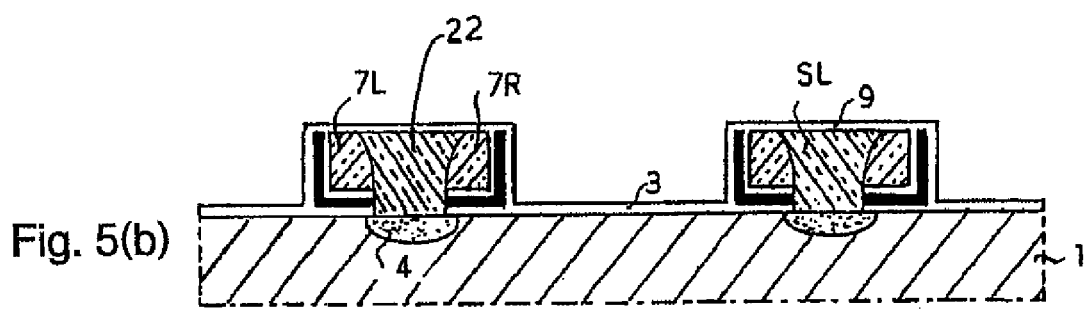
Figure 5C:
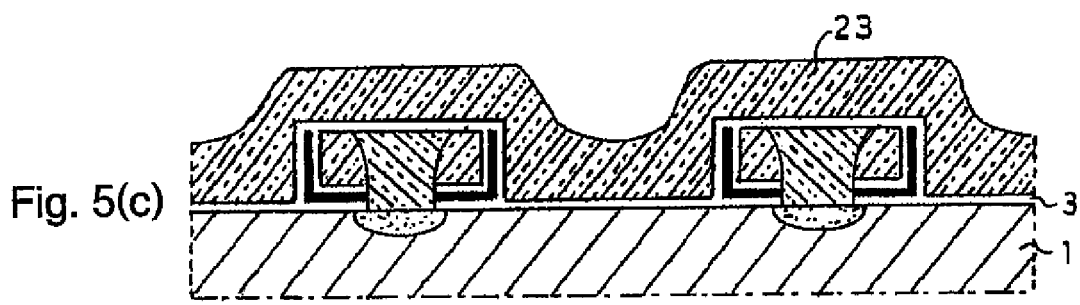
Figure 5D:
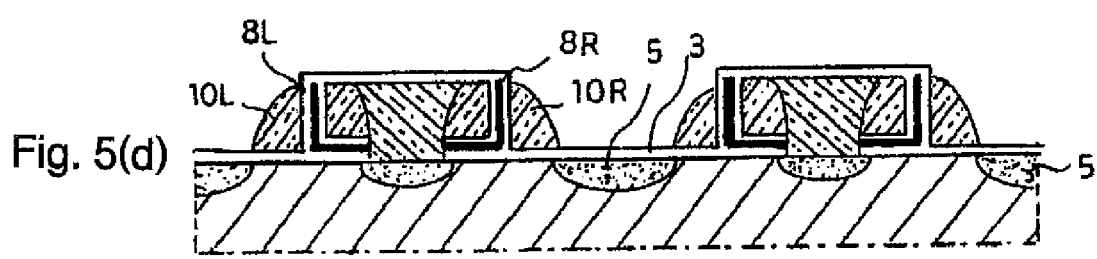
Figure 6A:
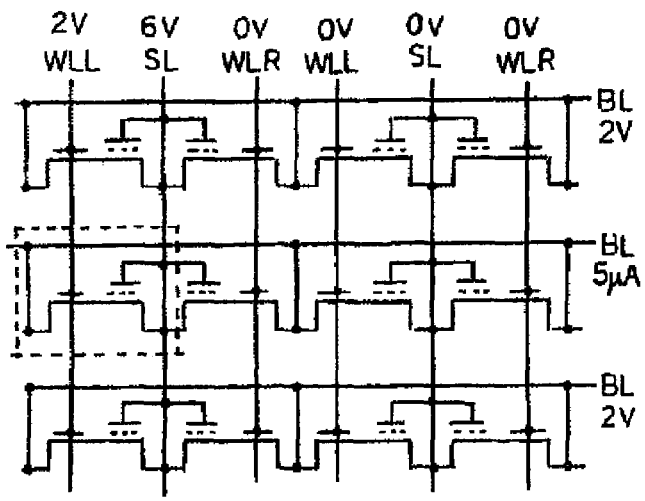
FIG. 6 is a diagram for describing the operation of the nonvolatile memory shown in FIG. 1.
Figure 6A:
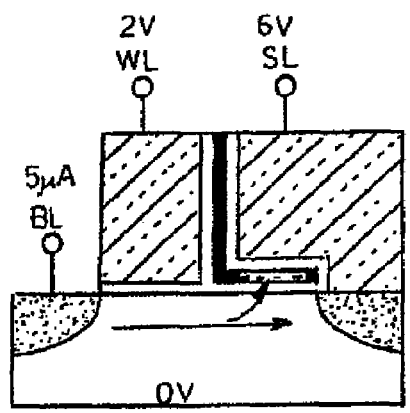
Figure 6B:
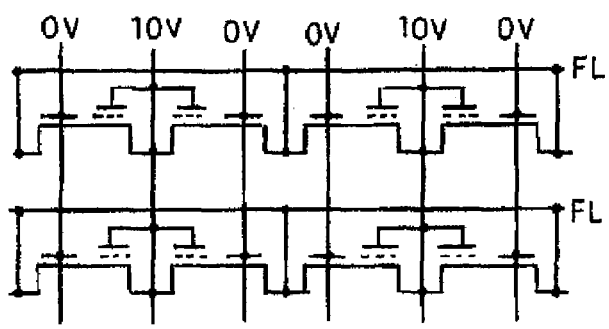
Figure 6B:
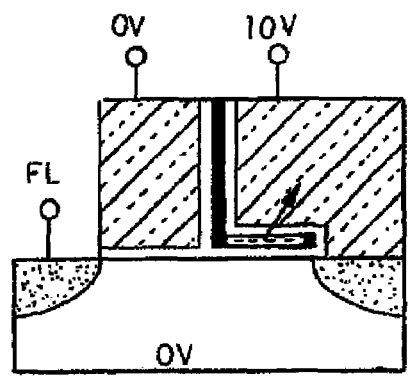
Figure 6C:
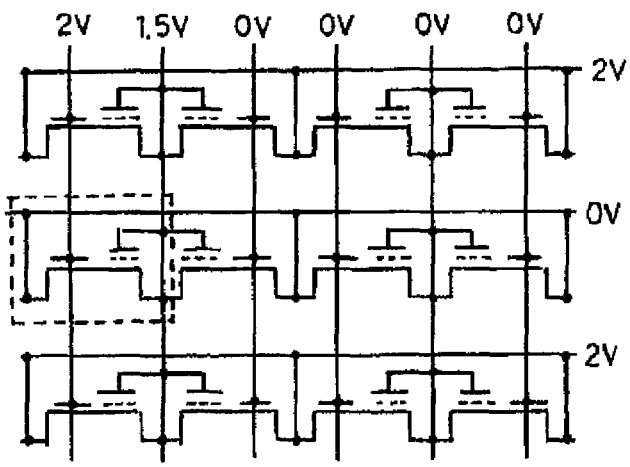
Figure 6C:
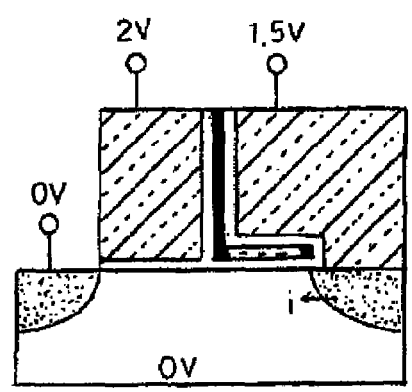

FIGS. 4 and 5 are process diagrams (part 1) and (part 2) showing a method for manufacturing the memory cells shown in FIG. 1. The method for manufacturing the memory cells shown in FIG. 1 will be explained below with reference to FIGS. 4 and 5.

(1) Process Step 1

An oxide film and a nitride film are sequentially formed over the entire surface of the silicon substrate 1. A resist pattern is formed by the known technology, using a first mask for forming device isolation regions 2 on the nitride film. The nitride film is etched with the resist pattern as a mask. Thereafter, the resist pattern is removed and a silicon substrate 1 is thermally oxidized. Further, when the nitride film and the oxide film are removed, device forming areas or regions separated from one another by the device isolation regions 2 based on silicon oxide appear.

Further, an oxide film 3 and a nitride film 21 are sequentially formed over the surface of the silicon substrate 1. At this time, the thickness of the nitride film 21 is set to the same degree as the thickness of each memory cell to be formed. A resist pattern is formed by the known technology, using a second mask for forming source diffusion layers 4 and gate regions for control gate electrodes 7 and the like in the device forming regions. The nitride film 21 is etched with the resist pattern as a mask, so that the strip-like nitride films 21 orthogonal to the device isolation regions 2 and disposed in parallel are left as diagonally shaded in FIG. 4(a). Thus, a plurality of trenches D, which are orthogonal to the device isolation regions 2 and whose both sides are demarcated by the nitride films 21, are formed.

(2) Process Step 2

Next, an ONO film is formed inside the trenches D, at bottoms and sidewall portions of the trenches D. The ONO film can be formed by, for example, forming a silicon oxide film by a short-time high temperature heat-treating method, forming a silicon nitride film on the silicon oxide film by a CVD method and thermally oxidizing the surface of the silicon nitride film. Further, n-type polysilicon used as a material for the control gate electrodes is charged into the trenches D formed with the ONO film. Incidentally, the ONO film and the polysilicon are formed not only inside the trenches D but also on the surface of each nitride film 21.

Thereafter, the surface of the silicon substrate 1 covered with the polysilicon is etched to remove the polysilicon placed on the nitride films 21 and the ONO film placed on the side therebelow. At this time, the polysilicon and ONO film on the nitride films 21 are removed, and the polysilicon and ONO film provided inside the trenches D are also removed. Thus, sidewalls comprised of the ONO film and polysilicon are left on their corresponding inner wall surfaces of the trenches D as shown in FIG. 5(*a*). Spaces reaching the surface of the silicon substrate 1 are defined in the centers of the trenches D. At this time, the polysilicon left as the sidewalls corresponds to control gate electrodes 7L and 7R. The ONO film left between the control gate electrodes 7L and 7R and the silicon substrate 1 corresponds to each of gate ONO films 6L and 6R. Also the ONO film left as sidewalls corresponds to each of inter-gate electrode insulating films 8L and 8R.

(3) Process Step 3

Impurity ions of phosphorous or arsenic or the like are implanted into the surface of the silicon substrate 1 through the spaces defined in the centers of the trenches D to form source diffusion layers 4. Further, n-type polysilicon 22 is embedded into the spaces of the trenches D, and the surfaces of the polysilicon 22 and control gate electrodes 7L and 7R left as the sidewalls are planarized. Here, the respective polysilicon 22 embedded into the trenches D result in source lines SL which respectively common-connect the control gate electrodes 7L and 7R of the plurality of memory cells arranged in the direction orthogonal to the device isolation regions 2.

Next, the surfaces of the control gate electrodes 7L and 7R and source lines SL are oxidized to form insulating films 9. Thereafter, the nitride films 21 are removed to thereby complete such source regions and control gate regions as shown in FIG. 5(*b*).

(4) Process Step 4

The surface of the silicon substrate 1 subsequent to the removal of the nitride films 21 is oxidized and an oxide film 3 is formed again. Thereafter, n-type polysilicon 23 is deposited over the entire surface of the silicon substrate 1 as shown in FIG. 5(*c*) to form gate electrodes 10L and 10R.

(5) Process Step 5

The polysilicon 23 deposited over the oxide film 3 and the insulating films 9 is removed by etching. Thus, the polysilicon 23 is left on the side surfaces of the inter-gate electrode insulating films 8L and 8R as sidewalls, which are used as the gate electrodes 10L and 10R respectively. In a manner similar to the source lines SL, the sidewalls result in word lines WLL and WLR which common-connect the gate electrodes 10L and 10R of the plurality of memory cells arranged in the direction orthogonal to the device isolation regions 2.

Further, the impurity ions of phosphorus or arsenic or the like are implanted into the silicon substrate 1 provided on the side below the thin oxide film 3 through the thin oxide film 3 disposed among the inter-gate electrode insulating films 8 of the respective adjacent memory cells. Thus, drain diffusion layers 5 are formed as shown in FIG. 5(*d*).

(6) Process Step 6

The drain diffusion layers 5 are formed and the entire surface of the silicon substrate 1 is covered with an intermediate insulating film 11. The surface of the intermediate insulating film 11 is planarized and thereafter contact holes that reach the drain diffusion layers 5 are defined in the intermediate insulating film 11. And contacts 12 of tungsten or the like are charged into the contact holes respectively. Further, bit lines BL for electrically connecting the drain diffusion layers 5 of the respective memory cells adjacent to one another in the horizontal direction of the figure are provided. Thus, the memory cells shown in FIG. 1 are completed. Since subsequent process steps are well-known techniques, their description will be omitted.

The operation of each memory cell referred to above will next be explained.

FIGS. 6(*a*) through 6(*c*) are operation explanatory diagrams of the nonvolatile memory shown in FIG. 1, wherein FIG. 6(*a*) shows an operation at writing, FIG. 6(*b*) shows an operation at erasure, and FIG. 6(*c*) shows an operation at reading, respectively.

(a) Operation at Writing

When writing (ion implantation) is effected on the corresponding memory cell indicated by a broken line frame in FIG. 6(*a*), a low voltage (e.g., 2V) is applied to a word line WL to which the memory cell to be written is connected, and a high voltage (e.g., 6V) is applied to its corresponding source line SL. A constant current source of, for example, 5 µA or so is connected to a bit line BL to be written. The voltage applied to the bit line BL at this time ranges from about 0.2V to about 0.3V. Incidentally, word lines WL and source lines SL irrelevant to the memory cell to be written are set to 0V, and bit lines BL are set to 2V.

Thus, the word line WL is set to the low voltage for the role of controlling a current, and the source line SL is set to the high voltage for the role of accelerating electrons. Therefore, some of electrons that flow from the bit line BL to the source line SL are attracted to the corresponding gate ONO film 6 as CHE efficiently by a difference in gate potential between two transistors TR1 and TR2 and stored therein.

(b) Operation at Erasing

An erase operation is effected on all memory cells in unison.

The word lines WL are all set to 0V and the source lines SL are all set to a high voltage (e.g., 10V). The bit lines BL are all set to a floating state.

Thus, the electrons stored in the gate ONO film 6 are tunnelled from a conduction band in a nitride film N of the ONO film 6 to a conduction band of an oxide film O thereof, after which they are pulled out to the corresponding source lines SL to which the high voltage is applied.

(c) Operation at Reading

When the reading of a memory cell indicated by a broken line frame in FIG. 6(*c*) is performed, a low voltage (e.g., 2V) is applied to a word line WL to which the memory cell to be read, and a low voltage (e.g., 1.5V) is applied to a source line SL. A bit line BL to be read is set to 0V. Incidentally, other word lines WL and source lines SL are set to 0V and other bit lines BL are set to 2V.

Thus, if electrons are being stored in the corresponding gate ONO film 6, no current flows from the source line SL to the bit line BL. If no electrons are stored in the gate ONO film 6, then the current flows. Accordingly, the presence or absence of the current that flows through the bit line BL is determined to enable reading of the contents stored in the corresponding memory cell.

As described above, the nonvolatile memory according to the present embodiment has the following advantages.

(i) The common source line SL connects the source diffusion layer 4 and control gate electrodes 7L and 7R of each memory cell selected by the common word lines WL. Thus, a low current and high-speed writing are enabled in a manner similar to the conventional MONOS cell. Further, the memory cell can greatly be simplified in structure as compared with the conventional MONOS cell in which the source diffusion layer 4 and the control gate electrodes 7L and 7R are isolated by the insulating film.

(ii) Since the drain diffusion layers 5 of the memory cells adjacent to one another are common-connected by the bit line BL, there is no fear of occurrence of the influence of a high voltage applied for writing on each memory element unintended for writing.

(iii) Upon formation of each memory cell, only the two masks for the formation of the device isolation regions and the formation of the gate regions are used and regions other than those are all formed on a self-alignment basis. It is therefore possible to reduce the cost of Its manufacturing.

(iv) Since most process steps can be executed on a self-alignment basis, there are no variations in the characteristic due to alignment displacements. Further, since it is not necessary to provide allowance for alignment, the size of each memory cell can be reduced.

Incidentally, the present invention is not limited to the above embodiment, and various modifications can be made thereto. For instance, the used materials and the manufacturing process steps are illustrated by way of example. If materials having similar characteristics and process steps for enabling a similar element to be formed are taken, then they are applicable as an alternative to the present embodiment.

What is claimed is:

1. A non-volatile memory comprising:
   a substrate having a first surface;
   first diffusion regions in the first surface of the substrate, the first diffusion regions spaced apart from each other;
   a second diffusion region in the first surface of the substrate between the first diffusion regions;
   first and second ONO films over the first surface of the substrate, the first and second ONO films extending along the first surface of the substrate from respective opposite sides of the second diffusion region, and both also extending in a direction substantially perpendicular from the first surface;
   a source line in electrical contact with the second diffusion region;
   a first control gate electrode over the first ONO film, and between the source line and the first ONO film;
   a second control gate electrode over the second ONO film, and between the source line and the second ONO film, the source line also in electrical contact with the first and second control gate electrodes;
   a first gate over the first surface of the substrate and on a sidewall of the first ONO film, the first ONO film disposed between the first gate and the first control gate electrode;
   a second gate over the first surface of the substrate and on a sidewall of the second ONO film, the second ONO film disposed between the second gate and the second control gate electrode; and
   a bit line electrically connecting the first diffusion regions.

2. The non-volatile memory of claim 1, wherein the first and second diffusion regions, the first and second ONO films, the source line, the first and second control gate electrodes, and the first and second gates are a memory cell.

3. The non-volatile memory of claim 2, further comprising additional memory cells adjacent to the memory cell and sharing the first diffusion regions.

4. The non-volatile memory of claim 1, wherein the first and second gates are respectively electrically in contact with first and second word lines.

5. The non-volatile memory of claim 1, wherein the first and second control gate electrodes respectively accelerate electrons for storage in the first and second ONO films.

6. A non-volatile memory comprising:
   first and second diffusion regions in a first surface of a substrate, the second diffusion region between the first diffusion regions;
   first and second ONO films extending over the first surface of the substrate from opposite respective sides of the second diffusion region, each of the first and second ONO films having a first section that extends in a direction parallel to the first surface of the substrate and having a second section that extends in a direction substantially perpendicular from the first surface of the substrate;
   a source line electrically in contact with the second diffusion region;
   first and second control gate electrodes respectively over the first sections of the first and second ONO films, and between the source line and the second sections of the first and second ONO films, the first and second control gates are in electrical contact with the source line;
   first and second gates over the first surface of the substrate and as sidewalls respectively on the second sections of the first and second ONO films; and
   a bit line electrically in contact with the first diffusion regions.

7. The non-volatile memory of claim 6, wherein the first and second diffusion regions, the first and second ONO films, the source line, the first and second control gate electrodes, and the first and second gates are a memory cell.

8. The non-volatile memory of claim 7, further comprising additional memory cells adjacent to the memory cell and sharing the first diffusion regions.

9. The non-volatile memory of claim 6, wherein the first and second gates are respectively electrically in contact with first and second word lines.

10. The non-volatile memory of claim 6, wherein the first and second control gate electrodes respectively accelerate electrons for storage in the first and second ONO films.

* * * * *